(12) United States Patent
Femal (10) Patent No.: US 7,853,850 B2
(45) Date of Patent: Dec. 14, 2010

(54) TESTING HARDWARE COMPONENTS TO DETECT HARDWARE FAILURES

(75) Inventor: Michael J. Femal, St. Petersburg, FL (US)

(73) Assignee: Raytheon Company, Waltham, MA (US)

( * ) Notice: Subject to any disclaimer, the term of this patent is extended or adjusted under 35 U.S.C. 154(b) by 373 days.

(21) Appl. No.: 12/024,557

(22) Filed: Feb. 1, 2008

(65) Prior Publication Data

US 2008/0189581 A1 Aug. 7, 2008

Related U.S. Application Data

(60) Provisional application No. 60/887,760, filed on Feb. 1, 2007.

(51) Int. Cl.
G01R 31/28 (2006.01)
G06F 11/00 (2006.01)

(52) U.S. Cl. .......................... 714/738; 714/43; 714/56; 714/712; 714/724; 714/717

(58) Field of Classification Search .................. None
See application file for complete search history.

(56) References Cited

U.S. PATENT DOCUMENTS

| | | | | |
|---|---|---|---|---|
| 3,851,122 A * | 11/1974 | Gibson | ............ | 379/16 |
| 4,825,438 A * | 4/1989 | Bennett et al. | ................. | 714/56 |
| 5,467,340 A | 11/1995 | Umezu | ........................ | 370/14 |
| 5,617,531 A * | 4/1997 | Crouch et al. | ................. | 714/30 |
| 5,729,678 A * | 3/1998 | Hunt et al. | ..................... | 714/43 |
| 5,790,523 A * | 8/1998 | Ritchie et al. | ................ | 370/241 |
| 5,850,512 A * | 12/1998 | Song | ............................ | 714/43 |
| 6,317,230 B1 | 11/2001 | Kitajima et al. | ............. | 359/110 |
| 6,546,507 B1 * | 4/2003 | Coyle et al. | .................... | 714/43 |
| 6,567,576 B2 | 5/2003 | MacDonald | ................. | 385/17 |
| 6,754,843 B1 | 6/2004 | Lu et al. | ........................ | 714/4 |
| 7,016,396 B2 * | 3/2006 | Agrawal et al. | ............. | 375/135 |
| 7,324,913 B2 * | 1/2008 | Clark et al. | ................. | 702/122 |
| 7,610,526 B2 * | 10/2009 | Sherlock et al. | ............. | 714/724 |
| 7,661,039 B2 * | 2/2010 | Boudon et al. | ............. | 714/707 |
| 7,685,482 B2 * | 3/2010 | Warren | ....................... | 714/724 |
| 7,685,487 B1 * | 3/2010 | Kuo et al. | .................... | 714/726 |
| 2002/0048279 A1 * | 4/2002 | Saitoh | ........................ | 370/465 |
| 2003/0070122 A1 * | 4/2003 | Lin | ............................. | 714/43 |
| 2003/0093727 A1 * | 5/2003 | Belschner et al. | ............. | 714/56 |
| 2004/0088604 A1 * | 5/2004 | Bland et al. | ................... | 714/43 |
| 2005/0169629 A1 * | 8/2005 | Shioda et al. | .................. | 398/5 |
| 2006/0168483 A1 * | 7/2006 | Sherlock et al. | ............... | 714/43 |
| 2010/0041349 A1 * | 2/2010 | Mahany et al. | ................ | 455/88 |

* cited by examiner

*Primary Examiner*—Jeffrey A Gaffin
*Assistant Examiner*—Guerrier Merant
(74) *Attorney, Agent, or Firm*—Baker Botts L.L.P.

(57) ABSTRACT

A system for testing hardware components includes a test pattern injector and a test pattern detector coupled to verification paths that pass through hardware components. The test pattern injector generates unique test patterns. A test pattern tests hardware features of the hardware components of a corresponding verification path. The test pattern injector injects the test patterns into the corresponding verification paths. The test pattern detector establishes expected test patterns. An expected test pattern matches an injected test pattern of a corresponding verification path. The test pattern detector determines whether received test patterns match the expected test patterns.

21 Claims, 5 Drawing Sheets

TESTING HARDWARE COMPONENTS TO DETECT HARDWARE FAILURES

RELATED APPLICATION

This application claims benefit under 35 U.S.C. §119(e) of U.S. Provisional Application Ser. No. 60/887,760, entitled "Time Division Multiplexed Communication Network Verification System,", filed Feb. 1, 2007, by Michael J. Femal.

TECHNICAL FIELD

This disclosure generally relates to communication systems, and more particularly to testing hardware components to detect hardware failures.

BACKGROUND

A matrix switch, such as a Time-Division Multiplexing (TDM) matrix switch, can establish connections for communication and switch calls from one connection to another connection. The matrix switch may also provide digital signal processing, such as converter processing, echo control, compression, and encryption. A hardware failure, however, may cause an undetectable misconnect in the matrix switch, which may lead to a security violation.

SUMMARY OF THE DISCLOSURE

In accordance with the present invention, disadvantages and problems associated with previous techniques for testing hardware components to detect hardware failures may be reduced or eliminated.

According to one embodiment of the present invention, a system for testing hardware components includes a test pattern injector and a test pattern detector coupled to verification paths that pass through hardware components. The test pattern injector generates unique test patterns. A test pattern tests hardware features of the hardware components of a corresponding verification path. The test pattern injector injects the test patterns into the corresponding verification paths. The test pattern detector establishes expected test patterns. An expected test pattern matches an injected test pattern of a corresponding verification path. The test pattern detector determines whether received test patterns match the expected test patterns.

Certain embodiments of the invention may provide one or more technical advantages. A technical advantage of one embodiment may be that a test pattern injector injects a test pattern into a verification path, and a test pattern detector detects the test pattern to test the hardware components of path.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 5 of the drawings, like numerals being used for like and corresponding parts of the various drawings.

Figure 1:
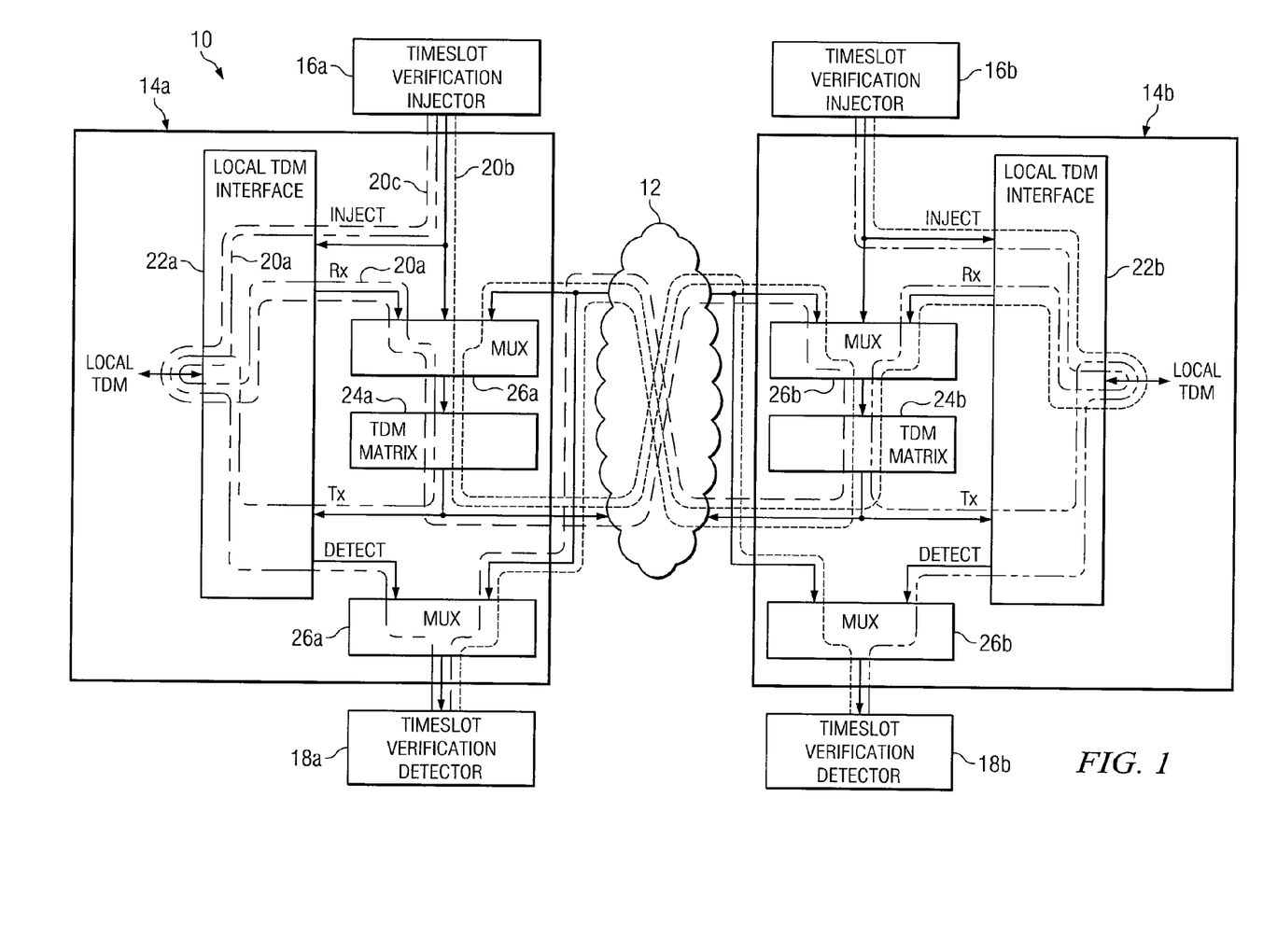
FIG. 1 illustrates one embodiment of a system that may be used to test features of hardware components of a verification path.

FIG. 1 illustrates one embodiment of a system 10 that may be used to test features of hardware components of a verification path 20. In the embodiment, system 10 includes a communication network 12, nodes 14 (14*a,b*), test pattern injectors 16 (16*a,b*), test pattern detectors 18 (18*a,b*), and verification paths 20 (20*a,b,c*) coupled as shown. In general, test pattern injector 16 injects a test pattern into a verification path 20, and test pattern detector 18 detects the test pattern to test the hardware components of path 20.

In one embodiment, system 10 tests hardware features of hardware components. A hardware component may include logic, memory, and interfaces, which may be embodied as one or more circuits. A hardware feature of a hardware component can be tested for failures or other errors. Examples of hardware features include point-to-point connectivity, conference processing, packet addressing, and trunk connectivity.

System 10 may detect any suitable hardware errors, such as hardware failures that can cause matrix misconnects. Examples of hardware errors include data and address failures. Data failures may yield incorrect data, and address failures may yield incorrect addresses. Examples of these errors include connection Random Access Memory (RAM) address or data failures, data RAM address failures, accumulator RAM address failures, and synchronization failures.

Connection RAM address or data failures occur at the connection RAM. The connection RAM includes information about call and conferencing connections, and may comprise a dual port memory. A connection RAM address or data failure may cause hardware to make incorrect connections.

Data RAM address failures occur at the data RAM. The data RAM holds incoming data, so the data can be distributed to the proper outgoing timeslot. Each timeslot is assigned to a different address in the memory. A data RAM address failure may cause multiple timeslots to use the same location in memory.

Accumulator RAM address failures occur at the accumulator RAM. The accumulator RAM holds audio for conferences, and may be a dual port memory. One port may be used to add timeslot audio to conferences, and one port may be used to access audio that is going to be sent to timeslots. An accumulator RAM address failure on a port may cause the wrong conference to be accessed.

Synchronization failures disrupt the coordination among the hardware components. In some cases, a TDM matrix switch may have an internal glitch, disrupting the operation of the switch.

In the embodiment, communication network 12 allows components to communicate with other components. Communication network 12 may comprise all or a portion of one or more of the following: a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, other suitable communication link, or any combination of any of the preceding.

In one embodiment, communication network 12 is a packet switched network, such as the Internet, that transports packets according to a Time-Division Multiplexing (TDM) protocol. Communication network 12 may transport communication signals using voice-over-IP (VoIP).

In the illustrated embodiment, system 10 tests features of nodes 14. A node 14 represents a network node that facilitates communication of packets in system 10. Examples of nodes 14 include servers, routers, gateways, and other devices that facilitate communication.

In the illustrated embodiment, node 14 includes a local TDM interface 22 (22a,b), a TDM matrix switch 24 (24a,b), and multiplexers (MUXs) 26 (26a,b). TDM interface 22 couples node 14 to other communication devices, such as endpoints or other communication systems.

Matrix switch 24 establishes connections for communication and switches calls from one connection to another connection. An example of matrix switch 24 may be a Pulse Code Modulation (PC) Time-Division Multiplexing (TDM) matrix switch. Matrix switch 24 may also perform other functions, such as converter processing, echo control, compression, and/or encryption. Multiplexers 26 multiplex or de-multiplex signals.

In the illustrated embodiment, system 10 includes verification paths 20 for performing the tests. A verification path 20 is a path through one or more hardware components that is used to send a test pattern to test features of the hardware components. A verification path 20 may be routed through any component of nodes 14 or communication network 12 to test hardware features.

Examples of verification paths 20 include matrix verification path 20a, trunk verification path 20b, and full path verification path 20c. Matrix verification path 20a goes through local TDM interface 22a and TDM matrix switch 24a to test hardware features of TDM matrix switch 24a. Trunk verification path 20b goes through TDM matrix switch 24a, communication network 12, and remote TDM matrix switch 24b to test hardware features of local node 14 to communication network 12. Full path verification path 20c goes through local TDM interface 22a, local TDM matrix switch 24a, remote TDM matrix switch 24b, remote TDM interface 22b to test hardware features through nodes 14a and 14b and communication network 12.

As mentioned above, test pattern injector 16 injects a test pattern into a verification path 20, and test pattern detector 18 detects the test pattern to test the hardware components of path 20. Test pattern injector 16 and/or test pattern detector 18 may be embodied as one or more circuits.

Test pattern injector 16 generates test patterns and injects the test patterns into test signals sent through verification paths 20. The test patterns may be injected as test signals. A test pattern may comprise one or more pseudo-random bit sequences. In one embodiment, test pattern injector 16 may comprise one or more circuits that include a Linear Feedback Shift Register (LFSR) that generates the pseudo-random bit sequences.

In one embodiment, test pattern injector 16 generates unique test patterns, where each test pattern tests a different verification path 20. Different test patterns may be used to test different paths 20, different errors, and/or different components. In one embodiment, taps of an LFSR may be adjusted to make each test pattern unique to a specific paths 20, error, and/or component. An example of test pattern injector 16 is described in more detail with reference to FIGS. 2A, 2B, and 4.

Test timeslots may carry the test patterns. Test patterns are injected in receive test timeslots and detected on transmit test timeslots. Test timeslots may be timeslots that are not otherwise used by system 10. Timeslots may be selected so that one address bit is changed at a time. Timeslots may be selected such that addressing failures are detected by using a walking 1 or 0 sequence, for example, 00h, 01h, 02h, 04h, 08h, 10h.

In one embodiment, one or more specific timeslots may test a particular path 20 for a particular type of failure. A test pattern may be detected on the same timeslots into which it was injected. In another embodiment, different timeslots may be used. Test patterns may be detected on timeslots that are different from the ones into which they was injected, but the test patterns may have the same order.

Any suitable number of test timeslots may be used. For example, for 1024 local timeslots with 512 conference accumulators, 11 test timeslots may be used for point-to-point connection tests, and 10 timeslots may be used for conference connection tests. In one embodiment, communication network 12 has 12 virtual trunks to which timeslots 1024 to 4095 are allocated. Each virtual trunk may use 11 of the timeslots as test timeslots. Two test timeslots may be used to test an end-to-end path test through the other matrix switch 14, and nine test timeslots may be used to detect packet addressing problems. A path can have more than one timeslot per frame.

Test pattern detector 18 compares a received test pattern with an expected test pattern. Test pattern detector 18 may generate the expected test patterns in a manner similar to or the same as that of test pattern injector 16. For example, test pattern detector 18 may have an LFSR that receives the same input as received by the test pattern injector LFSR, and thus generates the same test patterns as the test pattern injector LFSR.

Test pattern injector 16 and test pattern detector 18 need not be synchronized. Test pattern detector 18 may look for a test pattern that matches a particular expected test pattern. Once test pattern detector 18 locks onto the test pattern, detector 18 checks the test patterns that follow it.

Test pattern detector 18 detects whether a received test pattern matches an expected test pattern. A received test pattern may match an expected test pattern if the bits of the received test pattern are the same as the bits of the expected test pattern. Matching patterns indicate that system 10 is operating properly, while patterns that do not match indicate a hardware error.

If the patterns do not match, test pattern detector 18 may perform any suitable response. For example, test pattern detector 18 may provide a notification of a hardware error to a controller. Test pattern detector 18 may identify an error as a soft or hard failure. In one example, failures may be designated as soft until a threshold is exceeded, for example, a certain number of failures occur within a certain number of frames, such as four failures in a window of sixteen frames. Test pattern detector 18 may count the errors and provide a hard failure notification if the errors exceed the threshold.

Test pattern detector 18 may continue providing notifications until the controller notices the error. Test pattern detector 18 may attempt to restart the sequence based on the last received transmit data value. As another example, test pattern detector 18 may disable communication paths and/or switch communication paths to other redundant equipment. Test pattern detector 18 may perform these actions in response to a soft or hard failure. An example of test pattern detector 18 is described in more detail with reference to FIGS. 3 and 5.

In one embodiment, error detection may be initiated when matrix switch 24 is enabled. Test timeslots may be configured before matrix switch 24 is enabled to detect false failures when connections are made. In another embodiment, failure detection is disabled temporarily when switching between on-line and off-line modes to allow time for the circuitry to switch between local TDM and internal pattern injection.

A component of system 10 may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Modifications, additions, or omissions may be made to system 10 without departing from the scope of the invention. The components of system 10 may be integrated or separated. Moreover, the operations of system 10 may be performed by more, fewer, or other components. Additionally, operations of system 10 may be performed using any suitable logic comprising software, hardware, and/or other logic. As used in this document, "each" refers to each member of a set or each member of a subset of a set.

Figure 2A:
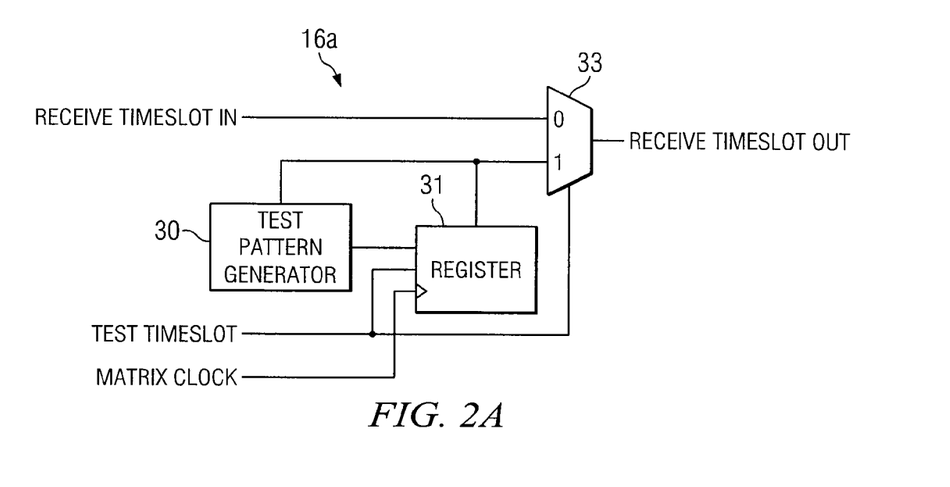
FIG. 2A illustrates one embodiment of a test pattern injector that may be used with the system of FIG. 1.

FIG. 2A illustrates one embodiment of test pattern injector 16 that may be used with system 10 of FIG. 1. In the illustrated embodiment, test pattern injector 16 includes a test pattern generator 30, a register 31, and a multiplexer 33.

Test pattern generator 30 generates test patterns. Test pattern generator 30 may comprise a circuit, such as an LFSR. In one embodiment, a 32-bit LFSR can create thousands of unique test patterns using different taps. Each 32-bit pattern may inserted in four byte PCM timeslots. An example of test pattern generator 30 is described in more detail with reference to FIG. 2B. Register 31 stores a current test pattern. Multiplexer 33 injects a test pattern into test timeslots.

Figure 2B:
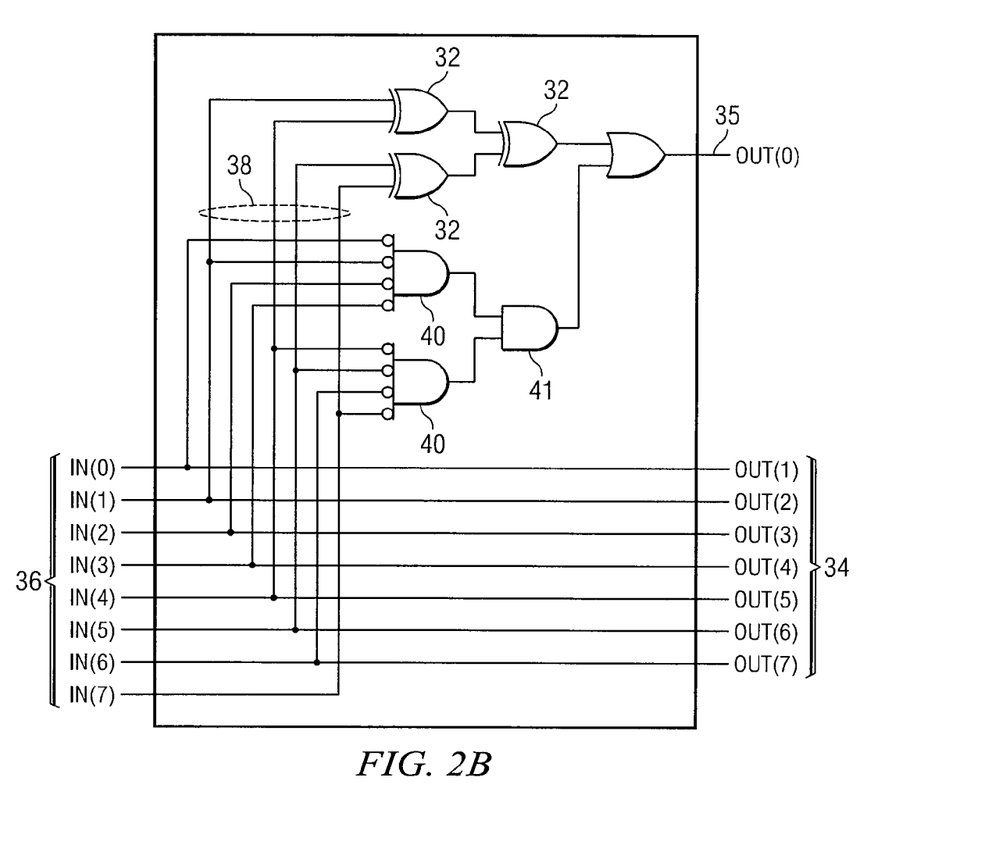
FIG. 2B illustrates one embodiment of a test pattern generator that may be used with the test pattern injector of FIG. 2A.

FIG. 2B illustrates one embodiment of test pattern generator 30 that may be used with test pattern injector 16 of FIG. 2A. In the illustrated embodiment, test pattern generator 30 comprises an LFSR that receives an input signal 36 and generates output signals 34 and 35. Test pattern generator 30 includes taps 38, exclusive-or (XOR) gates 32, not-and (NAND) gates 40, and an AND gate 41 coupled as shown.

Figure 3:
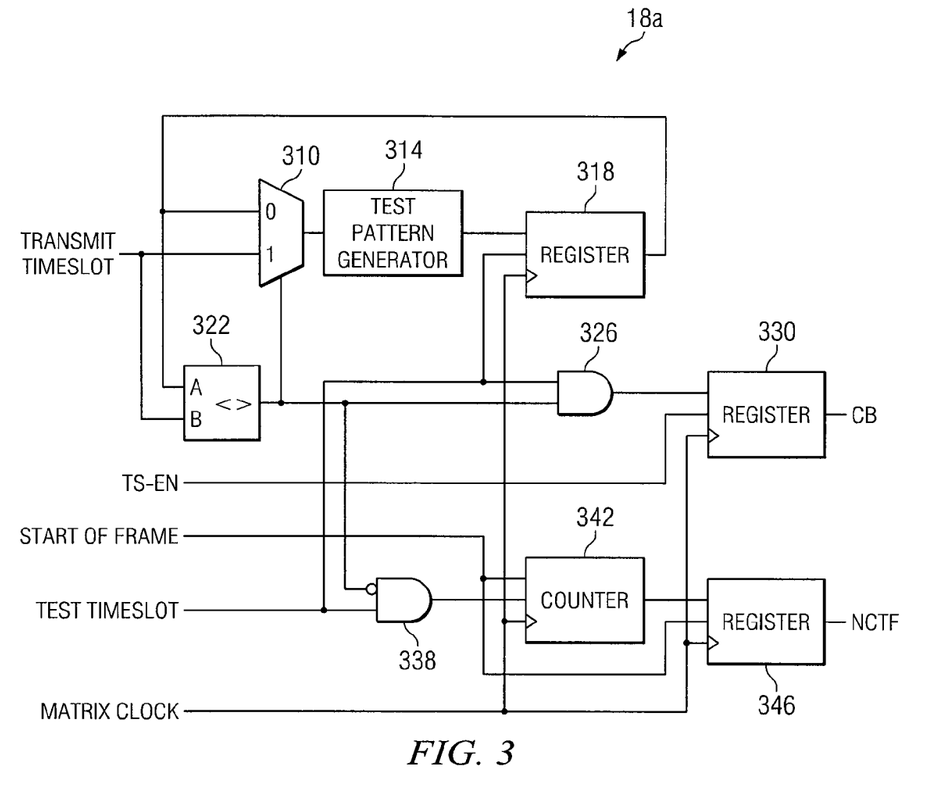
FIG. 3 illustrates one embodiment of a test pattern detector 18 that may be used with the system of FIG. 1.

In the embodiment, input signal 36 and output signal 34 may be n-bit signals, where n=8. Taps 38 receive input signal 36. XOR gates 32 manipulate the least significant bit of output signal 34 or bits of input signal 36 to yield output signal 35. NAND gates 40 yield a non-zero value for output signal 34 if input signal 36 FIG. 3 illustrates one embodiment of a test pattern detector 18 that may be used with system 10 of FIG. 1. Test pattern detector 18 analyzes test patterns received from paths 20. In the illustrated embodiment, test pattern detector 18 includes a multiplexer 310, an expected test pattern generator 314, and a register 318, a comparator 322, an AND gate 326, a register 330, an AND gate 338 with an inverter, a counter 342, and a register 346 coupled as shown.

Multiplexer 310, expected test pattern generator 314, and register 318 generate and store expected test patterns. Expected test pattern generator 314 may comprise a circuit, such as an LFSR, similar to that of test pattern generator 30. Comparator 50 compares a received test pattern from transmit timeslots with a expected test pattern from expected test pattern generator 314 to check whether the received test pattern matches the expected test pattern. AND gate 326 and register 330 output a connectivity Bad (CB) signal if the patterns do not match. AND gate 338, counter 342, and register 346 check whether the proper number of test timeslots were detected, and outputs the results in a Number of Continuity Timeslots in Frame word (NCTF) signal.

Figure 4:
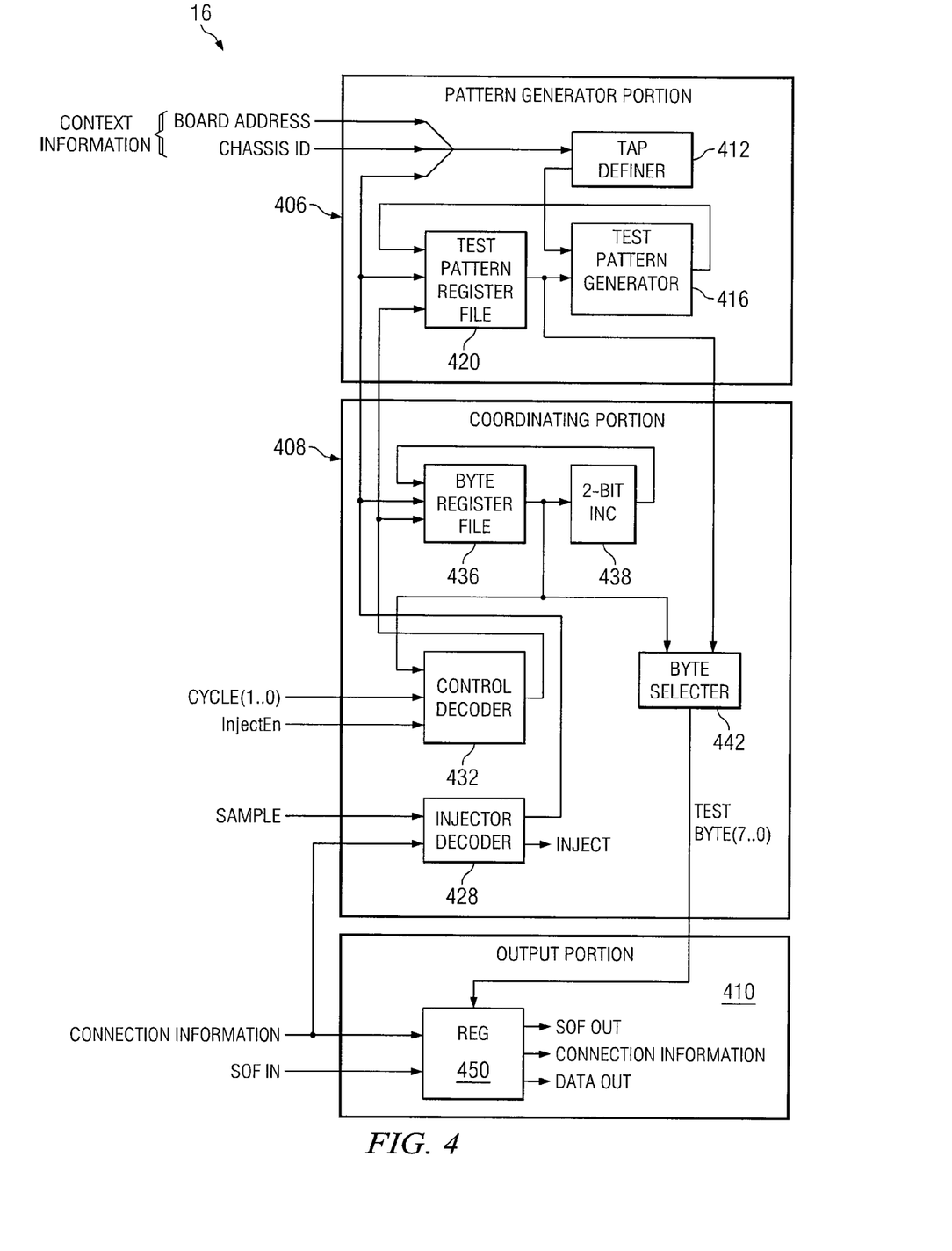
FIG. 4 illustrates another embodiment a test pattern injector that may be used with the system of FIG. 1.

FIG. 4 illustrates another embodiment test pattern injector 16 that may be used with system 10 of FIG. 1. In the embodiment, test pattern injector 16 includes a test pattern generator portion 406, a coordinating portion 408, and an output portion 410 coupled as shown. Test pattern generator portion 406 generates test patterns, coordinating portion 408 determines which test pattern is to be injected into test timeslots and when to the inject the test pattern, and output portion 410 outputs the frame with the test pattern.

Test pattern generator portion 406 comprises a tap definer 412, a test pattern generator 416 that comprises a LFSR, and a test pattern register file 420 coupled as shown. Tap definer 412 specifies a test pattern to be generated. In one embodiment, tap definer 412 receives context information that includes a board address and/or a chassis identifier. Tap definer 412 defines taps of the LSFR to generate the test pattern for the specific context information. The LSFR of test pattern generator 416 generates a next test pattern according to the taps defined by tap definer 412 and to a previous test pattern received from test pattern register file 420. Test pattern register file 420 stores a current test pattern until instructions from control decoder 432 and injector decoder 428 are received.

Coordinating portion 408 comprises an injector decoder 428, a control decoder 432, a byte register file 436, a 2-bit incrementer 438, and a byte selector 442 coupled as shown. Injector decoder 428 receives connection information and identifies the test pattern to be injected and the test timeslots where the test pattern is to be injected. Injector decoder 428 informs register files 420 and 438 of the test pattern and test timeslots.

Control decoder 432 determines when to write a new test pattern. Control decoder 432 instructs register files 420 and 438 to write of the next test pattern only when a previous test pattern has finished. Byte register file 436 and 2-bit incrementer 438 track the bytes of the test patterns. Byte selector 442 selects bytes of the test patterns from test pattern register file 420 according to instructions from byte register file 436, and sends the selected bytes to output portion 410.

Output portion 410 comprises a register 450. Register 450 aligns the connection information and the test pattern and injects the test pattern into the test timeslots. Register 450 outputs the injected test pattern.

Figure 5:
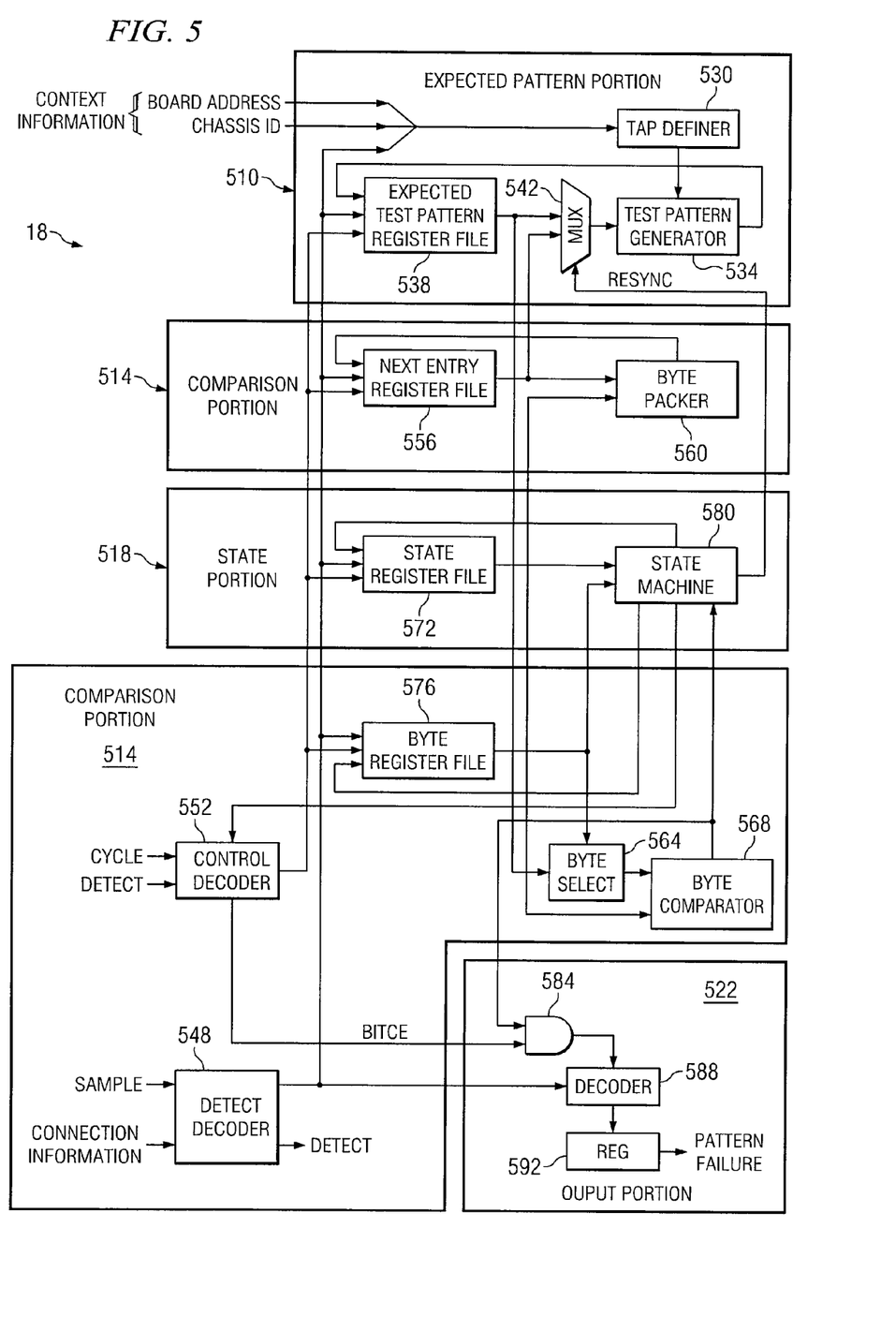
FIG. 5 illustrates another embodiment of a test pattern detector that may be used with the system of FIG. 1.

FIG. 5 illustrates another embodiment of test pattern detector 18 that may be used with system 10 of FIG. 1. In the embodiment, test pattern detector 18 includes an expected pattern generator portion 510, a comparison portion 514, a state portion 518, and an output portion 522 coupled as shown. Expected pattern generator portion 510 generates expected test patterns, and comparison portion 514 compares received test patterns with the expected test patterns. State portion 518 tracks the state of test pattern detector 18, and output portion 522 provides the output of test pattern detector 18.

Expected pattern generator portion 510 comprises a tap definer 530, an expected test pattern generator 534 that comprises a LFSR, an expected test pattern register file 538, and a multiplexer 542 coupled as shown. Expected pattern portion 510 may generate expected test patterns in a manner similar to or the same as the manner in which pattern generator portion 406 generates test patterns in order to generate expected test patterns that match the test patterns. In one embodiment, multiplexer 542 selects a previous expected test pattern or a previously received byte from a next entry register file 556, and sends the result to test pattern generator 534. The LSFR of test pattern generator 534 generates a next expected test pattern according to the taps defined by tap definer 530 and the result from multiplexer 542.

Comparison portion 514 includes a detector decoder 548, a control decoder 552, a byte register file 576, a next entry register file 556, a byte packer 560, a byte selector 564, and a byte comparator 568 coupled as shown. Detector decoder 548 receives connection information and identifies the injected test pattern and the test timeslots where the test pattern was injected. Detector decoder 548 informs register files 538, 556, 572, and 576 and decoder 588 of the injected test pattern and test timeslots.

Control decoder 552 determines when to detect a new test pattern. After a previous test pattern has been considered, control decoder 552 instructs register files 538, 556, 572, and 576 to initiate detection of the next test pattern. Byte register file 576 tracks the bytes of a received test pattern. Next entry register file 556 stores bytes of the received test pattern as predicted bytes of the received test pattern used to predict the next bytes of the test pattern. Byte packer 560 packs bytes of the received test pattern used to generate the next value in the pattern.

Byte selector 564 selects bytes of the expected test patterns from expected test pattern register file 538 according to instructions from byte register file 576, and sends the selected bytes to byte comparator 568. Byte comparator 568 compares the bytes of the expected test pattern with the bytes of the received test pattern to determine if the received test pattern matches the expected test pattern.

State portion 518 includes a state register file 572 and a state machine 580 coupled as shown. State machine 580 determines the state of test pattern detector 18 with information from byte register file 576 and byte comparator 568. In one example, states may include a detecting state, a locked state, and a losing state. Detector 18 is detecting a test pattern in the detecting state, has locked onto a test pattern in the locked state, and is losing a test pattern in the losing state. State register file 572 stores the state. State machine 580 may also inform multiplexer 542, control decoder 552, and byte register file 576 of the state.

Output portion 522 includes an AND gate 584, a decoder 588, and a register 592 coupled as shown. AND gate 584 indicates whether byte comparator 568 detects a failure in accordance with instructions from control decoder 552. Decoder 588 determines that a pattern has failed in accordance with output from AND gate 584 and which pattern has failed accordance with output from control decoder 552. Decoder 588 stores a pattern failure indicator in register 592. The pattern failure indicator indicates that a pattern failure has occurred and which pattern has failed.

Modifications, additions, or omissions may be made to the methods described herein without departing from the scope of the invention. The methods may include more, fewer, or other steps. Additionally, steps may be performed in any suitable order.

Certain embodiments of the invention may provide one or more technical advantages. A technical advantage of one embodiment may be that a test pattern injector injects a test pattern into a verification path, and a test pattern detector detects the test pattern to test the hardware components of path.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A system for testing one or more hardware components, the system comprising:
a test pattern injector coupled to a plurality of verification paths, each verification path passing through one or more hardware components, the verification paths including a trunk verification path and a matrix verification path, the trunk verification path passing through a switch and a network, the matrix verification path passing through the switch but not the network, the test pattern injector configured to:
generate a plurality of unique test patterns, a test pattern generated to test one or more hardware features of the one or more hardware components of a corresponding verification path; and
inject the test patterns into the corresponding verification paths; and
a test pattern detector coupled to the verification paths, the test pattern detector configured to:
establish a plurality of expected test patterns, an expected test pattern matching an injected test pattern of a corresponding verification path;
receive the test patterns from the verification paths; and
for each corresponding verification path, determine whether the received test pattern matches the expected test pattern.

2. The system of claim 1, the test pattern injector comprising:
a Linear Feedback Shift Register (LFSR) configured to generate the plurality of unique test patterns.

3. The system of claim 1, the test pattern injector further configured to inject the test patterns into the corresponding verification paths by:
detecting a plurality of selected test timeslots of a frame; and
injecting a test pattern into the test timeslots.

4. The system of claim 1, the test pattern detector further configured to:
provide a notification if the received test pattern does not match the expected test pattern.

5. The system of claim 1, the test pattern detector further configured to:
determine that a number of hardware errors exceeds a threshold; and
provide a hard failure notification in response to the determination.

6. The system of claim 1, the test pattern detector further configured to determine whether the received test pattern matches the expected test pattern by:
   determining that a plurality of bits of the received test pattern are the same as a plurality of bits of the expected test pattern.

7. The system of claim 1, the test pattern detector further configured to establish the plurality of expected test patterns by:
   establishing the plurality of expected test patterns from previously received data independent of synchronization of the test pattern detector and the test pattern injector.

8. The system of claim 1:
   at least one verification path comprising a Random Access Memory (RAM); and
   at least one test pattern generated to test the one or more hardware features of the Random Access Memory of the verification path.

9. The system of claim 1, the test pattern injector embodied as a circuit.

10. The system of claim 1, the test pattern detector embodied as a circuit.

11. A method for testing one or more hardware components, the method comprising:
   generating, at a test pattern injector, a plurality of unique test patterns for a plurality of verification paths, each verification path passing through one or more hardware components, the verification paths including a trunk verification path and a matrix verification path, the trunk verification path passing through a switch and a network, the matrix verification path passing through the switch but not the network, a test pattern generated to test one or more hardware features of the one or more hardware components of a corresponding verification path;
   injecting the test patterns into the corresponding verification paths;
   establishing, at a test pattern detector, a plurality of expected test patterns, an expected test pattern matching an injected test pattern of a corresponding verification path;
   receiving, at the test pattern detector, the test patterns from the verification paths; and
   for each corresponding verification path, determining whether the received test pattern matches the expected test pattern.

12. The method of claim 11, the generating the plurality of unique test patterns further comprising:
   generating the plurality of unique test patterns using a Linear Feedback Shift Register (LFSR).

13. The method of claim 11, the injecting the test patterns into the corresponding verification paths further comprising:
   detecting a plurality of selected test timeslots of a frame; and
   injecting a test pattern into the test timeslots.

14. The method of claim 11, further comprising:
   providing a notification if a received test pattern does not match an expected test pattern.

15. The method of claim 11, further comprising:
   determining that a number of hardware errors exceeds a threshold; and
   providing a hard failure notification in response to the determination.

16. The method of claim 11, the determining whether the received test pattern matches the expected test pattern further comprising:
   determining that a plurality of bits of the received test pattern are the same as a plurality of bits of the expected test pattern.

17. The method of claim 11, the establishing the plurality of expected test patterns further comprising:
   establishing the plurality of expected test patterns from previously received data independent of synchronization of the test pattern detector and the test pattern injector.

18. The method of claim 11:
   at least one verification path comprising a Random Access Memory (RAM); and
   at least one test pattern generated to test the one or more hardware features of the Random Access Memory of the verification path.

19. The method of claim 11, the test pattern injector embodied as a circuit.

20. The method of claim 11, the test pattern detector embodied as a circuit.

21. A system for testing one or more hardware components, the system comprising:
   a test pattern injector coupled to a plurality of verification paths, each verification path passing through one or more hardware components, the verification paths including a trunk verification path and a matrix verification path, the trunk verification path passing through a switch and a network, the matrix verification path passing through the switch but not the network, the test pattern injector configured to:
      generate a plurality of unique test patterns, the test pattern injector comprising a Linear Feedback Shift Register (LFSR) configured to generate the plurality of unique test patterns, a test pattern generated to test one or more hardware features of the one or more hardware components of a corresponding verification path; and
      inject the test patterns into the corresponding verification paths by:
         detecting a plurality of selected test timeslots of a frame; and
         injecting a test pattern into the test timeslots; and
   a test pattern detector coupled to the verification paths, the test pattern detector configured to:
      establish a plurality of expected test patterns, an expected test pattern matching an injected test pattern of a corresponding verification path;
      receive the test patterns from the verification paths;
      for each corresponding verification path, determine whether the received test pattern matches the expected test pattern by:
         determining that a plurality of bits of the received test pattern are the same as a plurality of bits of the expected test pattern;
      provide a notification if the received test pattern does not match the expected test pattern;
      determine that a number of hardware errors exceeds a threshold; and
      provide a hard failure notification in response to the determination.

* * * * *